(12) United States Patent
Bao

(10) Patent No.: US 8,299,838 B2
(45) Date of Patent: Oct. 30, 2012

(54) COMBINED MIXER AND BALUN DESIGN

(75) Inventor: Mingquan Bao, Västra Frölunda (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 77 days.

(21) Appl. No.: 12/920,890

(22) PCT Filed: Mar. 25, 2008

(86) PCT No.: PCT/SE2008/050323
§ 371 (c)(1),
(2), (4) Date: Sep. 3, 2010

(87) PCT Pub. No.: WO2009/120117
PCT Pub. Date: Oct. 1, 2009

(65) Prior Publication Data
US 2011/0001540 A1    Jan. 6, 2011

(51) Int. Cl.
*H03D 7/14* (2006.01)

(52) U.S. Cl. ....................................................... 327/358

(58) Field of Classification Search .......... 327/355–359; 455/323, 326, 333
See application file for complete search history.

(56) References Cited

U.S. PATENT DOCUMENTS

| | | | | |
|---|---|---|---|---|
| 5,379,457 A | * | 1/1995 | Nguyen | 455/323 |
| 5,825,231 A | * | 10/1998 | Chevallier et al. | 327/356 |
| 7,633,328 B2 | * | 12/2009 | Leistner et al. | 327/355 |

* cited by examiner

*Primary Examiner* — Hai L Nguyen

(57) ABSTRACT

A circuit with inputs for first (LO) and second (IF) unbalanced signals at respective first and second frequencies, also comprising a mixer for the first and second input signals to produce a third signal (RF) at a third frequency at an output port. The mixer comprises first and second transistors which are cross-coupled to each other. Output terminals of the transistors are connected to the output port, and the mixer also comprises a first impedance connected to ground. The mixer, by means of the transistors and the first impedance is an active balun for the first input signal (IF), and the input port for the second signal (LO) comprises a second impedance, so that the first and second impedances together act as a passive balun for the second signal (LO).

4 Claims, 4 Drawing Sheets

COMBINED MIXER AND BALUN DESIGN

TECHNICAL FIELD

The present invention discloses a circuit with input ports for a first and a second signal at respective first and second frequencies. The circuit also comprises a mixer for mixing said first input signal with said second input signal.

BACKGROUND

In communication technology, so called mixers are a frequently used circuit, which, as the name implies, mix a first and a second input signal, which are usually at respective first and second frequencies, and produce an output signal at a third frequency.

In a transceiver in a communications system, a mixer will usually be utilized in order to mix an intermediate frequency (IF) into a radio frequency (RF), or vice versa, mixing RF to IF.

A balun ("balanced-unbalanced") is a component that converts a balanced signal into an unbalanced signal or vice versa, and which may be used together with certain kinds of mixers in which it is desired to convert an unbalanced input signal into a balanced one (or vice versa). A balun can be active or passive.

In a mixer, as has been explained above, two input signals are used, which means that with respect to the notion of balanced and unbalanced input signals, a number of cases can be discerned: If one of the input signals is unbalanced, that signal should be connected to the mixer via a balun, to convert it into a balanced signal. If both of the input signals are unbalanced, both of them need to be connected to the mixer via respective baluns, in order to convert the unbalanced input signals into balanced signals.

SUMMARY

Since, as explained above, baluns are often used together with mixers, the present invention discloses a solution by means of which a circuit can carry out the function of a mixer as well as the function of a balun, which is naturally advantageous when it comes to, for example, cost and size.

By means of the invention, a mixer is disclosed which can carry out the function of baluns for a first and a second unbalanced input signal which are to be mixed with each other, as well as being a mixer.

The inventive circuit comprises input ports for a first and a second unbalanced input signal, with the first and second input signals being at respective first and second frequencies.

In addition, the circuit also comprises a mixer for mixing the first and second input signals so that a third signal at a third frequency is produced at an output port of the circuit. To this end, the mixer comprises a first and a second transistor which are cross-coupled to each other, and the output terminals of the transistors are connected to the output port of the circuit.

Furthermore, the circuit also comprises a first impedance which is connected to ground, and by means of the transistors and the first impedance the mixer carries out the function of an active balun for the first input signal. Also, the input port for the second signal comprises a second impedance, and this second impedance, together with the first impedances acts as a passive balun for the second signal.

The two transistors of the circuit can suitably be capacitively cross-coupled to each other.

Also, the transistors which are used in the invention can be bipolar transistors, in which case the output terminals of the transistors are the collectors of the transistors. If bipolar transistors are used, they can suitably be cross coupled to each other via their respective bases.

As an alternative, the transistors which are used in the invention can be Field Effect Transistors, FETs, in which case the output terminals of the transistors are the drain of the transistors. If FETs are used, they can suitably be cross coupled via their respective gates.

As will be shown below, the invention also discloses an embodiment for the situation in which it is desired to mix a first unbalanced signal with a second balanced input signal.

BRIEF DESCRIPTION OF THE DRAWINGS

The invention will be described in more detail in the following, with reference to the appended drawings, in which.

DETAILED DESCRIPTION

Figure 1:
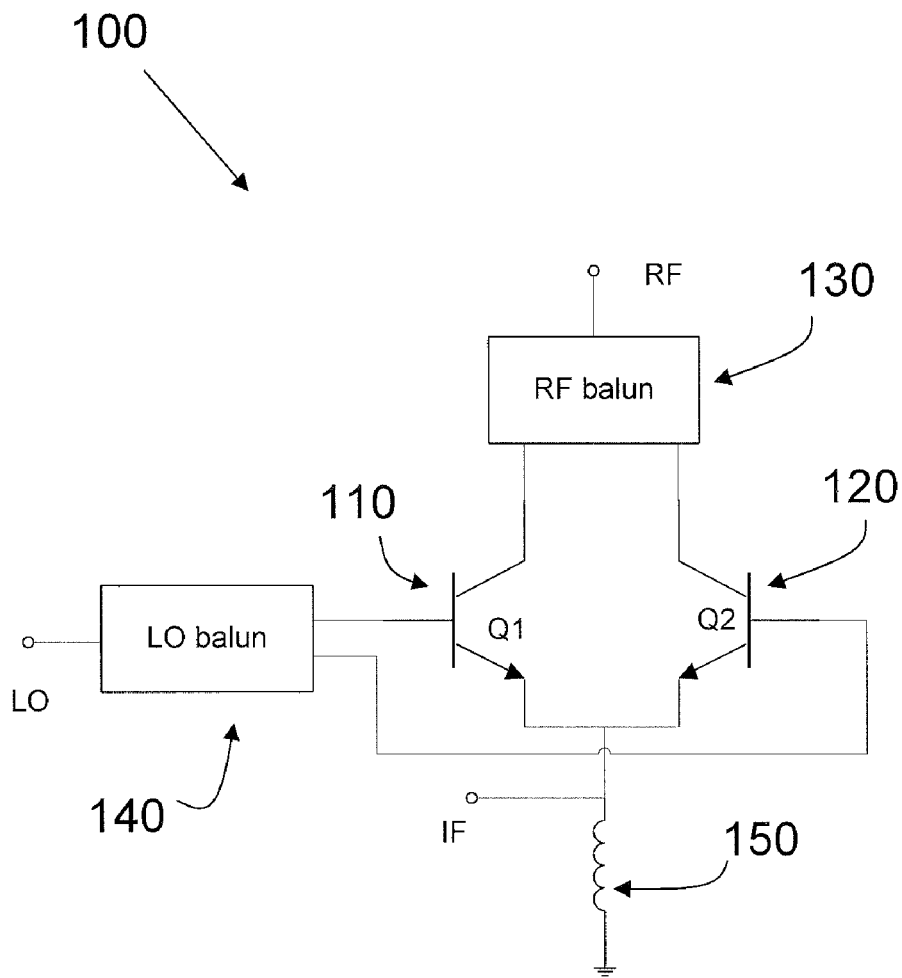
FIGS. 1 and 2 show prior art mixers with baluns.

FIG. 1 shows an example of a prior art mixer. In the examples of mixers given below, both prior art mixers as well as mixers of the invention, it will be assumed that the purpose of the mixers is to arrive at an output signal at Radio Frequency, RF, by means of mixing a signal at an Intermediate Frequency, IF with a signal from a Local Oscillator, an LO.

Thus, the input signals shown in the examples below will be an IF signal and a signal from an LO, which are mixed in order to obtain a RF signal.

However, it should be pointed out that the invention is not limited to such combinations of input/output signals.

Returning now to FIG. 1, there is shown a prior art mixer 100 which comprises a first 110 and a second 120 transistor, which are connected to each other. The transistors in the example are bipolar transistors, and are connected to each other via their respective emitters.

An unbalanced IF signal is input to the mixer 100 via the emitters of the two transistors, 110, 120.

An unbalanced LO signal is also used as input to the mixer 100, but is input via a balun 140, so that first and second components of a balanced LO signals are produced and can be used as input to the first 110 and second 120 transistors respectively, via the bases of the transistors.

The output terminals of the two transistors, in this case the collectors, are connected to a second balun 130, so that an unbalanced RF signal is produced as the output of the mixer 100, at the output port of the balun 130.

In addition, the mixer 100 also comprises an impedance, i.e. a resistive and/or reactive component, in this case an inductor 150, via which the input IF signal is connected to ground.

Figure 2:
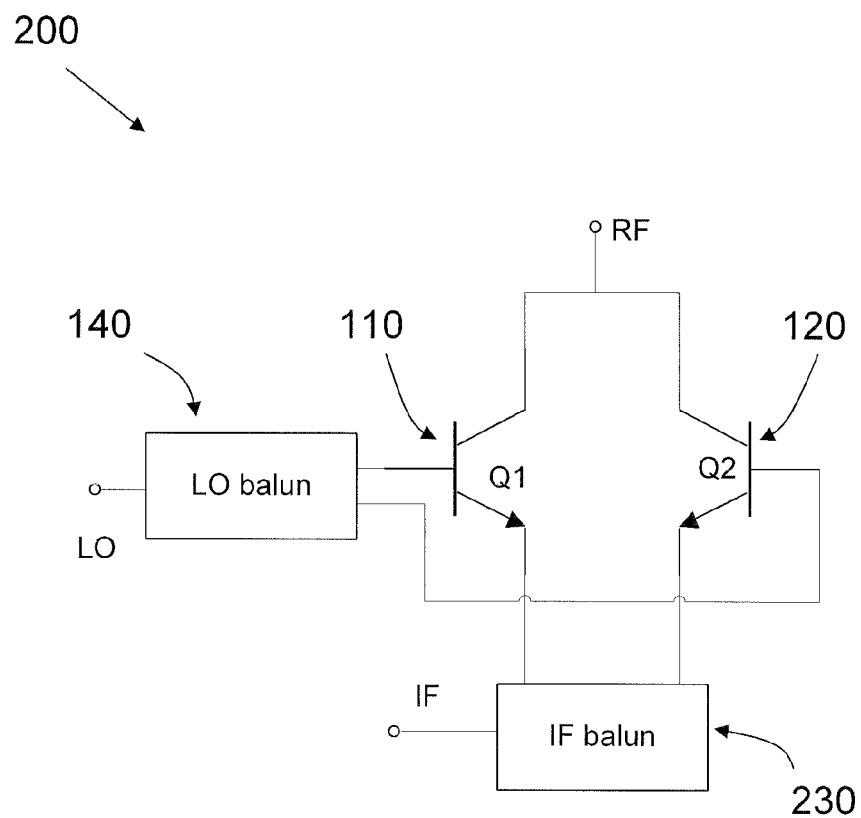

FIG. 2 shows another example of a prior art mixer 200. The prior art mixer 200 is similar to the one in FIG. 1, with the difference that here the IF signal is also input via a second balun 230, so that a balanced IF-signal pair is produced, which can be used as input to the emitters of each of the transistors. In this case, the output RF signal is unbalanced without the use of a balun at the output port.

Figure 3:
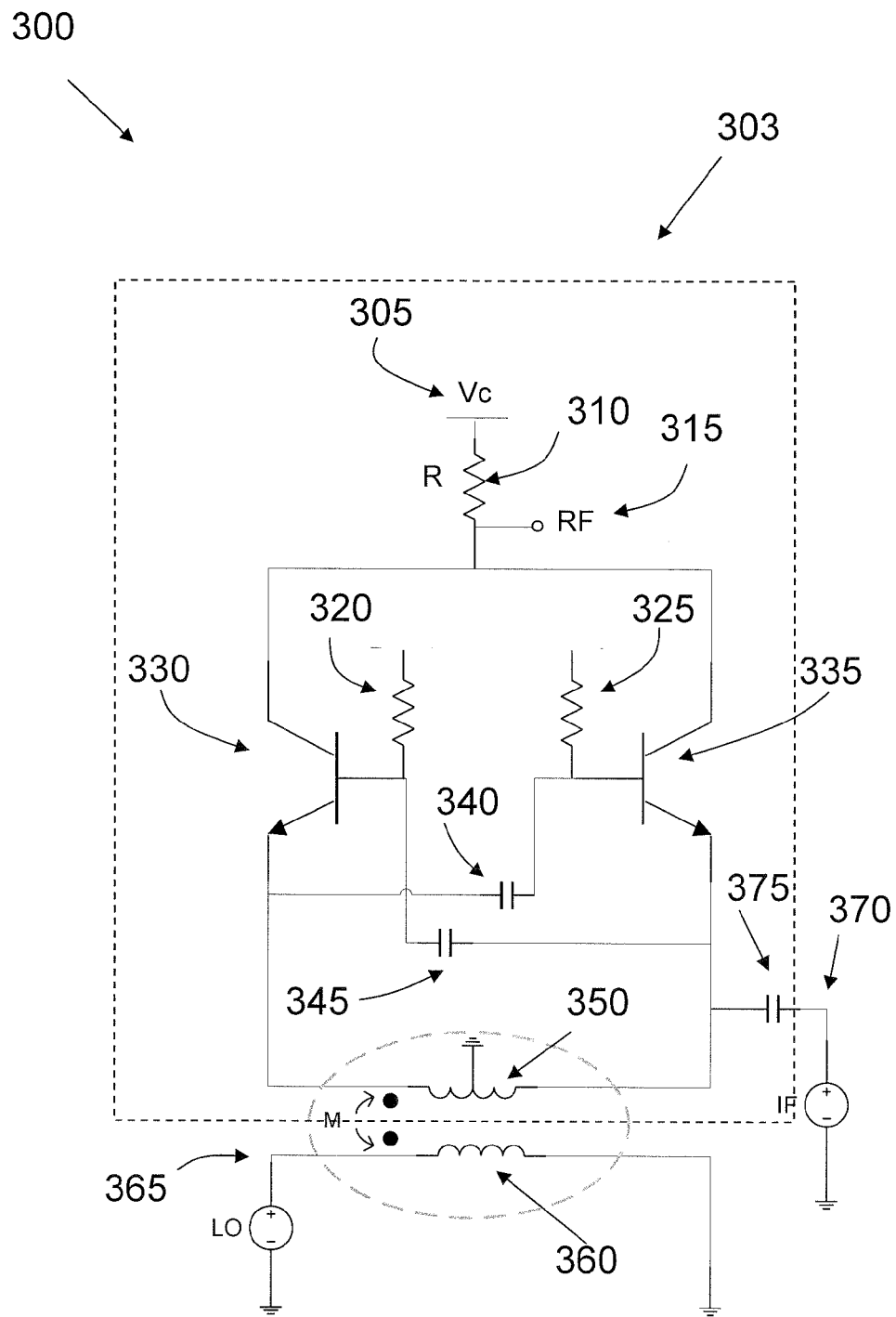
FIG. 3 shows a first embodiment of the invention.

FIG. 3 shows a diagram of a circuit 300 of the invention, which is intended for applications in which both of the input signals, i.e. the signals which are to be mixed with each other, are unbalanced:

As shown in FIG. 3, the embodiment 300 comprises input ports 365, 370, for a first and a second unbalanced input signal. In FIG. 3, the input signals which are to be mixed with each other are an IF signal and an LO signal. However, it should be understood that these input signals are merely used to show an example of a suitable application of the circuit 300.

As shown in FIG. 3, the circuit 300 also comprises a mixer 303 which will carry out the actual mixing of the two input signals. The mixer 303 of the circuit 300 comprises a first 330 and a second 335 transistor, which are cross-coupled to each other.

The transistors 330 and 335 of the circuit 300 are in FIG. 3 shown as bipolar transistors. In the case of bipolar transistors, the cross-coupling of the transistors is carried out by means of the base of each transistor being connected to the emitter of the other transistor, which is suitably done capacitively, i.e. via respective capacitances 340, 345. In addition, the base of each of the transistors 330, 335 is biased via respective grounding impedances 320, 325.

Output terminals of the transistors 330, 335, which in the case of bipolar transistors and the application of FIG. 3 are the collectors of the transistors, are connected to an output port 315 of the circuit 300. A third signal is produced, which is an RF signal, in the case of the mixed signals being those shown, i.e. an IF signal and an LO signal. The RF signal may be accessed at an output port 315 of the circuit, to which the collectors of the transistors are connected. The output port 315 is also biased with a DC voltage Vc 405, via impedance 310.

As can be seen in FIG. 3, the circuit 300 also comprises a first reactive component 350 which is connected to ground, and via which the emitters of the transistors 330, 335, are connected to each other.

Those parts of the circuit 300 which have been described so far comprise a mixer for the input signals, i.e. in this example the LO and IF signals.

However, the circuit 300, by means of the transistors and the first reactive component 350 also carries out the function of an active balun for the first input signal, i.e. in the example shown in FIG. 3 the IF signal, so that a pair of balanced IF-signals are produced as (anti-phase) base-emitter voltages $V_{BE}$ at the two transistors 330, 335.

In addition to the components described above, the circuit 300 also comprises a second impedance 360 serially connected to the input port 365 for the second signal, so that the second impedance can also be seen to be comprised in the input port 365. In the embodiment shown in FIG. 3, the second impedance 365 is an inductance, which is also the case for the first impedance 350.

Thus the two inductances 360, 350 will couple to each other, and will together act as a balun for the second signal, i.e. the Lo signal, so that a balanced LO signal pair is produced, one part of said pair on each side of the first inductance 350.

Hence, the design 300 will act as a mixer for the two input signals, as well as comprising a balun for each of the unbalanced input signals. In the case of the first input signal, the IF signal in the example above, the balun will be an active balun, i.e. one which consumes energy while in the case of the second signal, i.e. the LO signal in the example above, the balun will be passive, so that it will not need to consume energy It can also be mentioned that the cross-coupled transistor pair 320, 325, will act to actively compensate for the passive balun 350, 360, in that the transistor pair 330, 335 will act as a differential amplifier which corrects errors in amplitude and phase in the outputs of the passive balun over a wide range of frequencies.

In addition, the cross-coupled transistor pair 330, 335 will constitute a so called "mixer core": The differential IF and LO signals are applied at the two transistor's $V_{be}$, i.e. they are applied as voltages between the base and the emitter of each of the transistors.

In order to mix the input LO and IF signals, the nonlinear relationship between $I_c$ and $V_{be}$, i.e., $I_c \approx I_s \exp(V_{be}/V_T)$ is exploited in the circuit 300, where $I_s$ denotes the saturation current of bipolar transistor. The desired RF frequency component $f=f_{LO}+f_{IF}$ will be found in the collector currents of the transistors.

The differential IF and LO signals applied at the transistor pair will thus generate an in-phase RF signal at the output port 315 of the circuit 300.

As shown, the design 300 of the invention will thus provide a circuit which acts as a mixer for two unbalanced input signals, as well as acting as a first balun for the first input signal and as a second balun for the second input signal. As will be understood, the combination of these functions in one circuit is highly advantageous with regard to such parameters as, for example, circuit cost and size, as well as the DC power consumption, since the invention merges an active balun with a mixer.

As has been stated above, the embodiment shown in FIG. 3 and described in connection with that drawing is suitable for mixing two unbalanced signals. Another embodiment of the invention can be used if it instead is desired to mix an unbalanced signal with a balanced signal. This embodiment is shown as 400 in FIG. 4, and will be described below.

Figure 4:
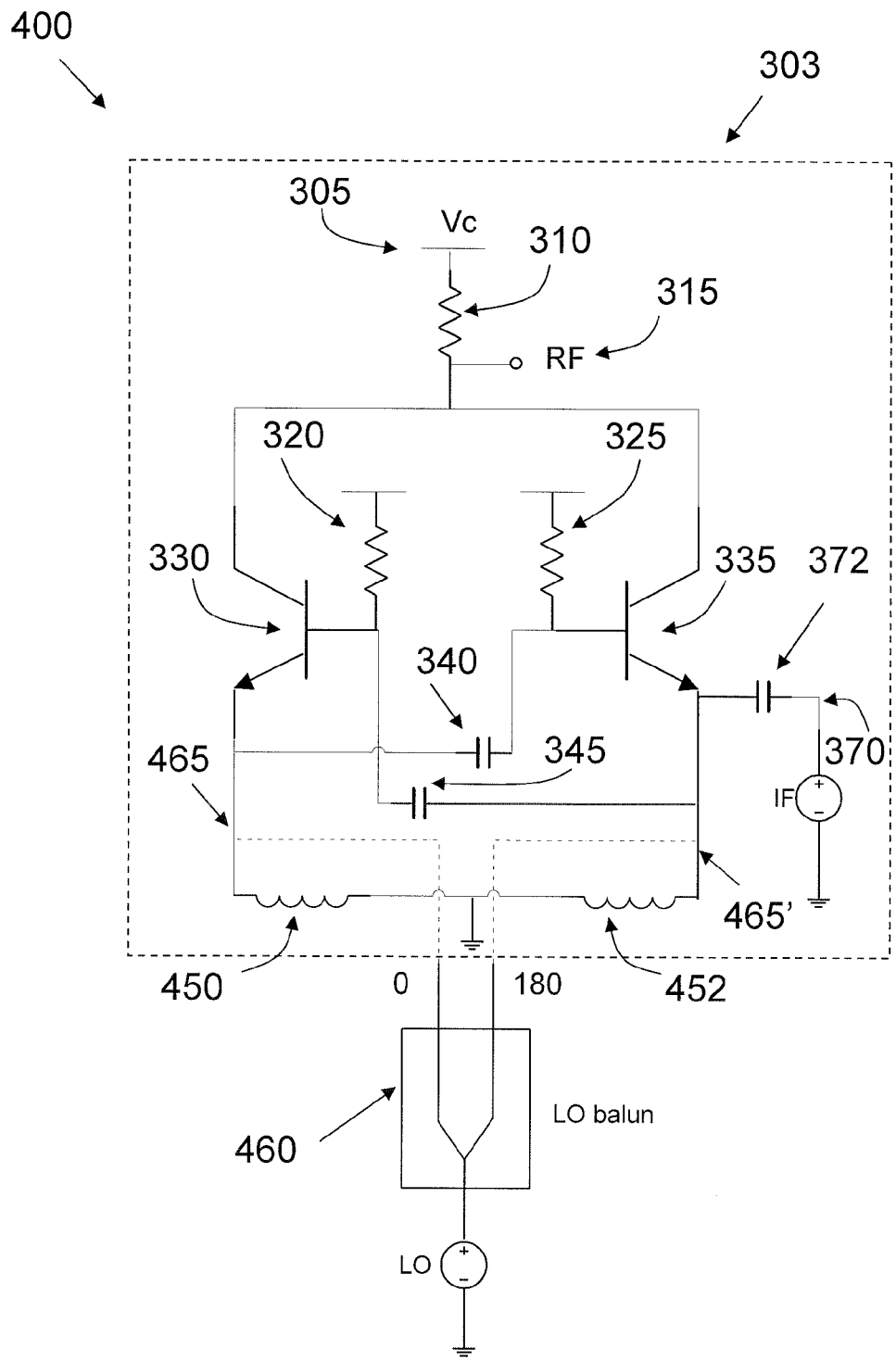
FIG. 4 shows a second embodiment of the invention.

Components in the circuit 400 which are similar to those of the circuit 300 of FIG. 3 have retained their reference numbers from FIG. 3, and will not be explained again in connection with FIG. 4.

It will be assumed that the unbalanced input signal to the circuit of FIG. 4 is the IF signal, and the balanced one is the LO-signal, although the opposite could also be the case.

As can be seen in FIG. 4, the main difference between the circuit 400 and the previous one, i.e. the circuit 300, is that since one of the signals, in this case the LO signal, is balanced, it will need to be input to the circuit 400 at two input ports, which are shown as 465 and 465' in FIG. 4.

In similarity to the circuit 300, the circuit 400 comprises an impedance, which in this case consists of two serially connected inductances 450, 452, with a point between these two resistances being connected to ground. The input ports 465, 465' for the balanced signal pair is on either side of this impedance.

As shown in FIG. 4, in order to arrive at a balanced LO-signal which may be input to the circuit 400, use can be made of a balun 460 which is external to the circuit 400. This external balun 460 will produce the balanced signal pair (0/180 degrees) which is input to the ports 465 and 465'.

Since the function of the rest of the circuit 400 is the same as that of the circuit 300 of FIG. 3, the description will not be repeated. Reference is simply made to the description above of the circuit 300 of FIG. 3.

As can be seen, the circuit 400 may also be seen as a "sub-set" of the circuit 300: the difference is that the circuit 300 has the second inductor 360 which interacts with the first inductor 350 to form a balun for the unbalanced input LO-signal, so as to produce a balanced signal "inside" the circuit. This is as opposed to the circuit 400, which does comprise first resistor 450, but which needs a balanced input signal, so that an external balun (or other means to create a balanced input signal) is needed.

In conclusion, by means of the invention, a number of advantages can be gained, such as, for example:

High RF/LO bandwidth;
Good isolation between LO and RF ports;
High linearity and moderate conversion gain;
A circuit of the invention consumes a small chip area by using a compact transformer balun and by means of not having to use an external (active) IF balun.

The proposed mixer topology can be implemented in any semiconductor technology, e.g., CMOS, bipolar, Silicon, GaAs etc. The proposed mixer can be also implemented in discrete circuits.

The invention is not limited to the examples of embodiments described above and shown in the drawings, but may be freely varied within the scope of the appended claims.

For example, the bipolar transistors used in the examples above in order to illustrate the invention may be replaced by Field Effect Transistors, FETs. In this case, the output terminals of the transistors are the drain of the FET transistors, and the FET transistors will be cross-coupled to each other via their respective gates Also, it should be understood that although the invention has been illustrated by means of LO and IF signals being mixed with each other, these signals are merely examples, the invention can be used to mix RF and LO signals to generate an IF signal, which is so-called "down-convert" mixer.

The invention claimed is:

1. A circuit which comprises input ports for a first unbalanced and a second balanced input signal at respective first and second frequencies, the circuit also comprising a mixer for mixing said first unbalanced input signal with said second balanced input signal, the mixer comprising a first and a second transistor which are cross-coupled to each other, so that a third signal at a third frequency is produced at an output port of the circuit to which output terminals of the transistors are connected, the circuit also comprising an impedance which is connected to ground, said circuit being characterized in that the mixer by means of the transistors and said impedance also carries out the function of an active balun for the first unbalanced input signal.

2. The circuit of claim 1, in which the transistors are capacitively cross-coupled to each other.

3. The circuit of claim 1, in which the transistors are bipolar transistors, and the output terminals of the transistors are the collectors of the transistors.

4. The circuit of claim 3, in which the transistors are cross coupled to each other via their respective bases.

* * * * *